United States Patent
Yamaguchi et al.

(10) Patent No.: US 11,310,448 B2
(45) Date of Patent: Apr. 19, 2022

(54) IMAGING APPARATUS AND OPTICAL LOW-PASS FILTER

(71) Applicant: CANON KABUSHIKI KAISHA, Tokyo (JP)

(72) Inventors: Yutaka Yamaguchi, Sakura (JP); Kazuhiko Momoki, Koshigaya (JP)

(73) Assignee: CANON KABUSHIKI KAISHA, Tokyo (JP)

( * ) Notice: Subject to any disclaimer, the term of this patent is extended or adjusted under 35 U.S.C. 154(b) by 323 days.

(21) Appl. No.: 16/718,947

(22) Filed: Dec. 18, 2019

(65) Prior Publication Data
US 2020/0228732 A1   Jul. 16, 2020

(30) Foreign Application Priority Data

Jan. 11, 2019 (JP) .............................. JP2019-003137
Feb. 25, 2019 (JP) .............................. JP2019-031285

(51) Int. Cl.
*H04N 5/357* (2011.01)
*G02B 5/30* (2006.01)

(52) U.S. Cl.
CPC ........... *H04N 5/357* (2013.01); *G02B 5/3083* (2013.01)

(58) Field of Classification Search
CPC .......................... H04N 5/357; G02B 5/3083; H01L 27/14621; H01L 27/14625
See application file for complete search history.

(56) References Cited

U.S. PATENT DOCUMENTS

| 2016/0341973 | A1  | 11/2016 | Ida et al. |
| 2018/0004003 | A1* | 1/2018  | Momoki ............. G02B 27/288 |
| 2019/0109992 | A1  | 4/2019  | Momoki |
| 2019/0199897 | A1  | 6/2019  | Momoki |

FOREIGN PATENT DOCUMENTS

| JP | H10186284 A  | 7/1998 |
| JP | 2015213306 A | 11/2015 |
| JP | 2018004913 A | 1/2018 |

\* cited by examiner

*Primary Examiner* — Lin Ye
*Assistant Examiner* — John H Morehead, III
(74) *Attorney, Agent, or Firm* — Carter, DeLuca & Farrell LLP

(57) ABSTRACT

An imaging apparatus includes an optical low-pass filter that includes first, second, third, and fourth optical anisotropic elements configured to separate an incident ray into a plurality of rays, and a retardation plate disposed between two optical anisotropic elements adjacent to each other among the first to fourth optical anisotropic elements, and an image sensor configured to photoelectrically convert an optical image formed by light that has passed the optical low-pass filter. A predetermined condition is satisfied.

22 Claims, 13 Drawing Sheets

| PHASE DIFFERENCE $\Delta =(2m+1)\lambda/4$ | PHASE DIFFERENCE $\Delta =m\lambda$ | PHASE DIFFERENCE $\Delta =(2m+1)\lambda/2$ |
|---|---|---|
| 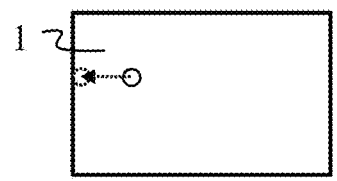 | 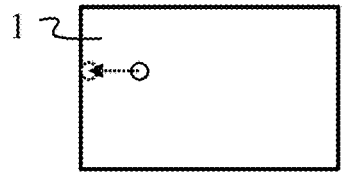 | 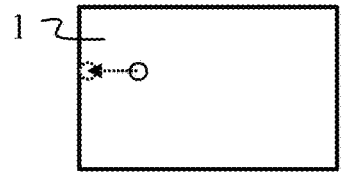 |
| 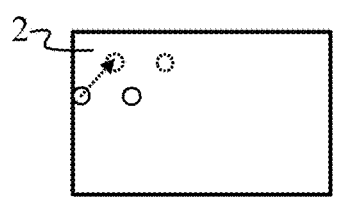 | 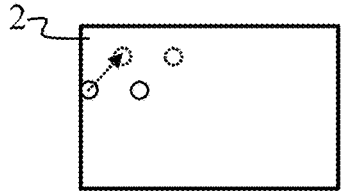 | 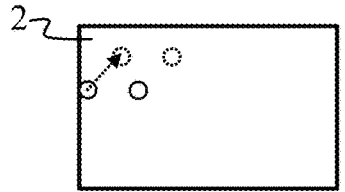 |
| 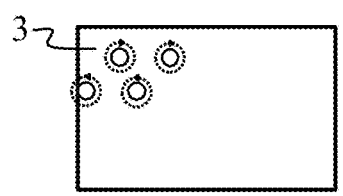 | 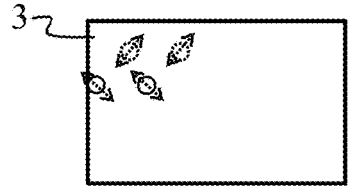 | 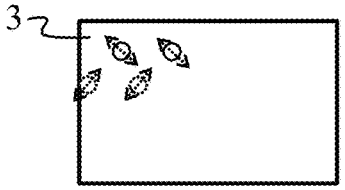 |
| 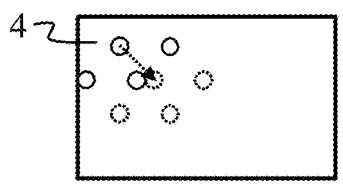 | 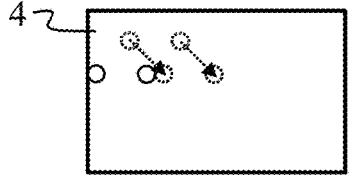 | 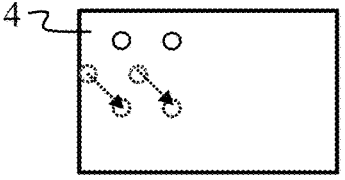 |
| 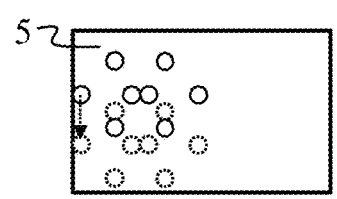 | 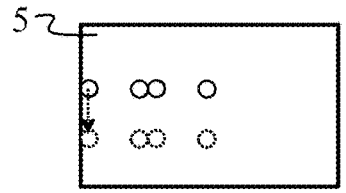 | 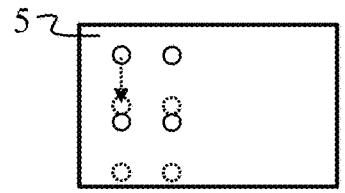 |
| FIG. 3A | FIG. 3B | FIG. 3C |

| PHASE DIFFERENCE $\Delta$ $=(2m+1)\lambda/4$ | PHASE DIFFERENCE $\Delta$ $=m\lambda$ | PHASE DIFFERENCE $\Delta$ $=(2m+1)\lambda/2$ |
|---|---|---|
| 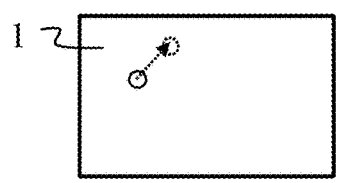 | 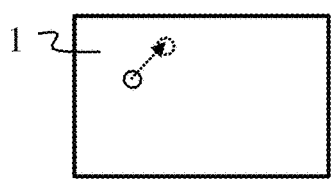 | 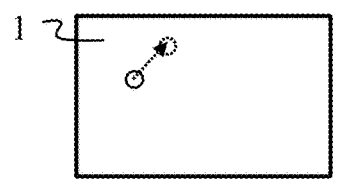 |
| 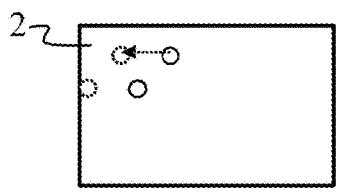 | 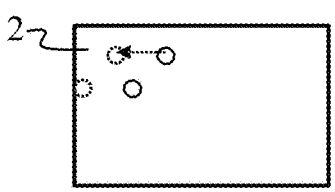 | 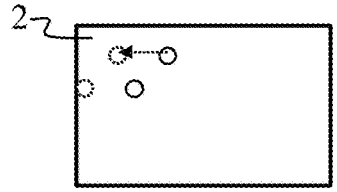 |
| 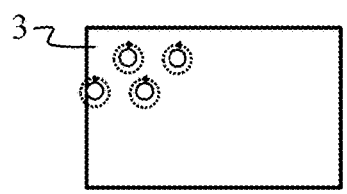 | 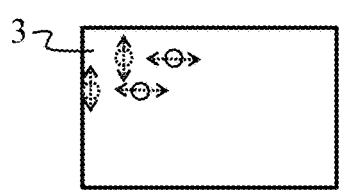 | 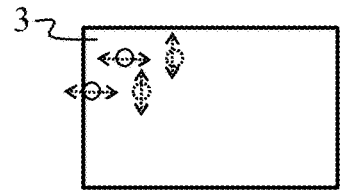 |
| 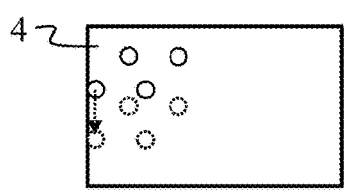 | 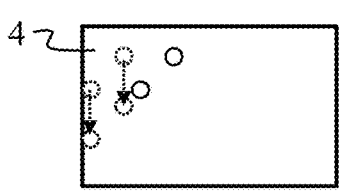 | 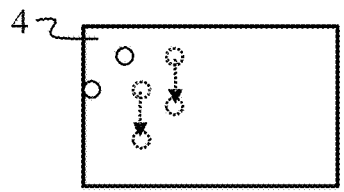 |
| 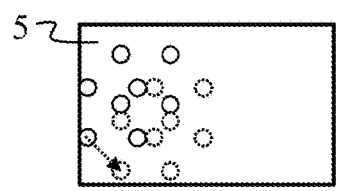 | 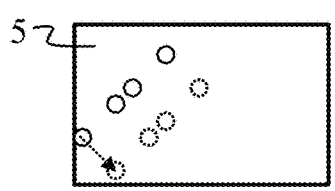 | 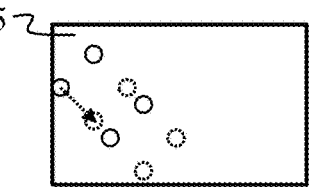 |
| FIG. 4A | FIG. 4B | FIG. 4C |

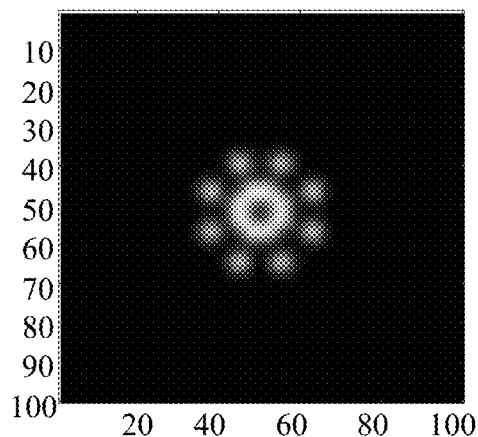
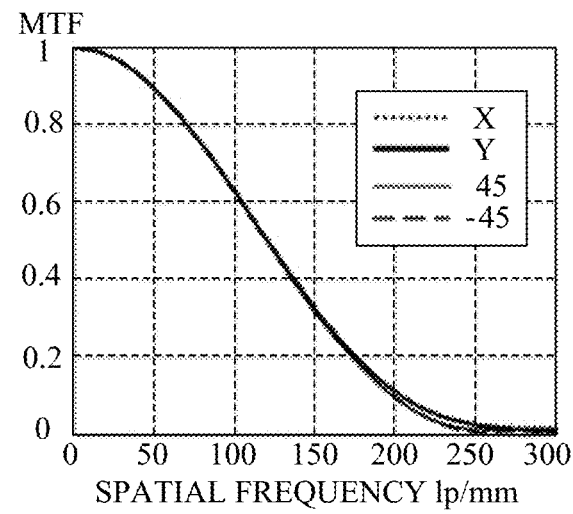
FIG. 7A
FIG. 7B
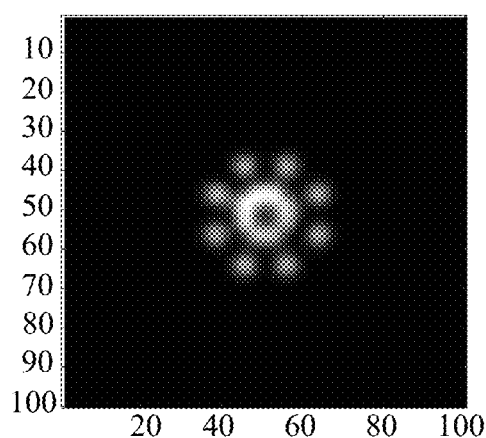
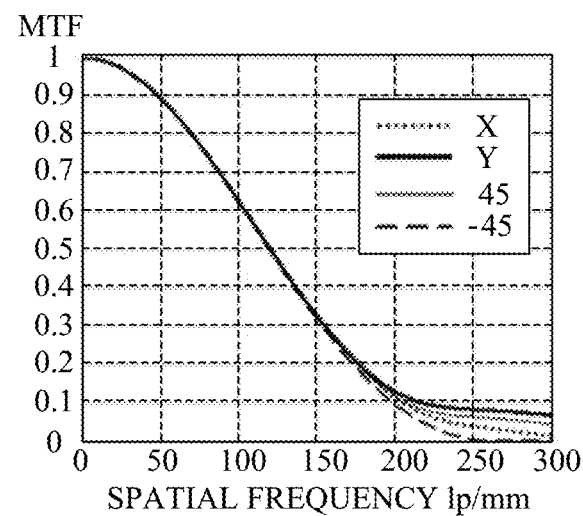
FIG. 8A
FIG. 8B

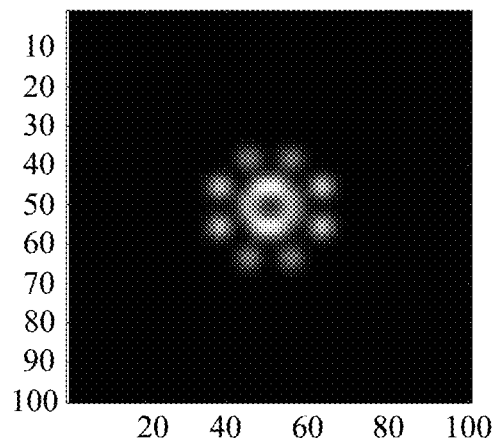
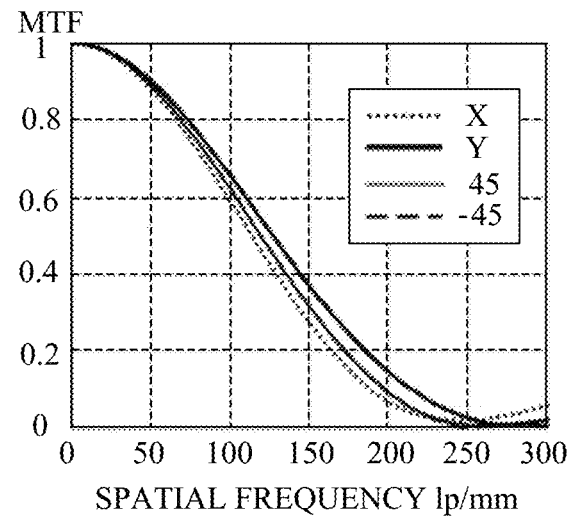
FIG. 9A  FIG. 9B
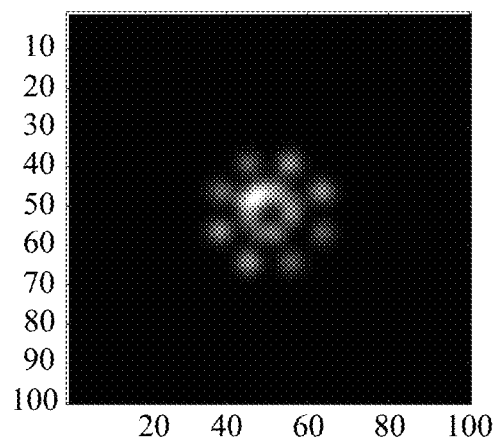
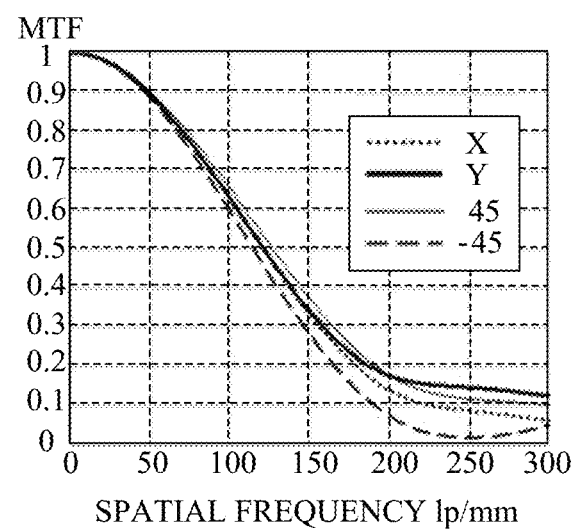
FIG. 10A  FIG. 10B

IMAGING APPARATUS AND OPTICAL LOW-PASS FILTER

BACKGROUND OF THE INVENTION

Field of the Invention

The present invention relates to an imaging apparatus having an optical low-pass filter, and a multipoint separation type optical low-pass filter suitable for the imaging apparatus.

Description of the Related Art

An imaging apparatus, such as a digital camera, using a solid state image sensor, such as a CCD sensor and a CMOS sensor, uses an optical low-pass filter to suppress a generation of a false color and moiré in a captured image. The optical low-pass filter limits high-frequency image information equal to or higher than the Nyquist frequency by controlling the image point distribution formed by light.

Japanese Patent Laid-Open No. ("JP") 2015-213306 discloses an optical low-pass filter that improves a high-frequency resolution and suppresses a generations of the false color and moiré by stacking six layers to eight layers of the birefringent optical elements and by forming a Gaussian shaped point image distribution. JP 10-186284 discloses an optical low-pass filter that includes a retardation plate (waveplate or phase plate) formed of a polyimide film and disposed between birefringent optical elements that separate light into eight points, thereby separating the light in vertical and horizontal directions and in a diagonal direction.

Since the separated point images have uniform intensities in the optical low-pass filter disclosed in JP 2015-213306, it is necessary to set an angle between the ray separation directions of the birefringent optical elements adjacent to each other to 45° or 135°. As a result, the freedom degree of arrangement of the birefringent optical elements is limited. Further, when an optical low-pass filter that includes the retardation plate for eliminating a polarization disposed between the birefringent optical elements as disclosed in JP 10-186284 is applied to four or more layered birefringent optical elements, the wavelength dependency of the point image varies depending on the position of the retardation plate. Hence, in order for the optical low-pass filter to stably obtain a false color suppression effect or the like, it is necessary to properly set an arrangement of the retardation plate and the birefringent optical elements and a phase difference generated by the retardation plate.

JP 2018-4913 discloses an optical low-pass filter that improves the high-frequency resolution and suppresses the false color and moiré by layering four birefringent optical elements as optical anisotropic elements and by forming a Gaussian-shaped separated point-image distribution.

Quartz is often used for the birefringent optical element. However, it is conceivable to use thin lithium niobate for at least one of the four layered birefringent optical elements in the optical low-pass filter disclosed in JP 2018-4913 so as to reduce the entire filter thickness. Then, it is necessary to consider the filter strength.

SUMMARY OF THE INVENTION

The present invention provides an imaging apparatus using an optical low-pass filter having a high freedom degree of arrangement of birefringent optical elements and a stable characteristic. The present invention provides a thin and strong optical low-pass filter using four or more layered birefringent optical elements.

An imaging apparatus according to one aspect of the present invention includes an optical low-pass filter that includes first, second, third, and fourth optical anisotropic elements configured to separate an incident ray into a plurality of rays, and a retardation plate disposed between two optical anisotropic elements adjacent to each other among the first to fourth optical anisotropic elements, and an image sensor configured to photoelectrically convert an optical image formed by light that has passed the optical low-pass filter. The following condition is satisfied–

$$-0.20 \leq I \leq 0.20$$

$$I = \int_{\lambda_{max}}^{\lambda_{min}} s(\lambda) \cdot \cos(2\pi/\lambda \cdot \delta(\lambda)) d\lambda$$

where $\lambda$ is a wavelength of the ray, $\delta(\lambda)$ is a phase difference of the retardation plate, $S(\lambda)$ is a normalized spectral sensitivity spectrum of the image sensor, and $\lambda max$ and $\lambda min$ are the longest wavelength and the shortest wavelength in an integration range that is 10% or more of a peak intensity of the $S(\lambda)$, respectively. The optical low-pass filter also constitutes another aspect of the present invention.

An optical low-pass filter according to another aspect of the present invention includes, in order from the light incident side to the light emitting side, first, second, third, and fourth optical anisotropic elements configured to separate an incident ray into a plurality of rays. The first and fourth optical anisotropic elements made of quartz, and the second and third optical anisotropic elements are made of lithium niobate. An imaging apparatus having this optical low-pass filter also constitutes another aspect of the present invention.

Further features of the present invention will become apparent from the following description of exemplary embodiments with reference to the attached drawings.

BRIEF DESCRIPTION OF THE DRAWINGS

FIGS. 3A to 3C illustrate point images formed by light that has transmitted through the birefringent optical elements according to this embodiment.

FIGS. 4A to 4C illustrate other point images formed by light that has transmitted through the birefringent optical elements according to this embodiment.

FIGS. 7A and 7B illustrate a point image distribution formed by an optical low-pass filter according to Example 1 and a spatial frequency characteristic of the optical low-pass filter.

FIGS. 8A and 8B illustrate a point image distribution formed by an optical low-pass filter according to a variation of Example 1, and a spatial frequency characteristic of the optical low-pass filter.

FIGS. 9A and 9B illustrate a point image distribution formed by an optical low-pass filter according to Comparative Example 1 and a spatial frequency characteristics of the optical low-pass filter.

FIGS. 10A and 10B illustrate a point image distribution formed by the optical low-pass filter according to Comparative Example 2 and a spatial frequency characteristic of the optical low-pass filter.

DESCRIPTION OF THE EMBODIMENTS

Referring now to the accompanying drawings, a description will be given of embodiments according to the present invention.

Figure 1:
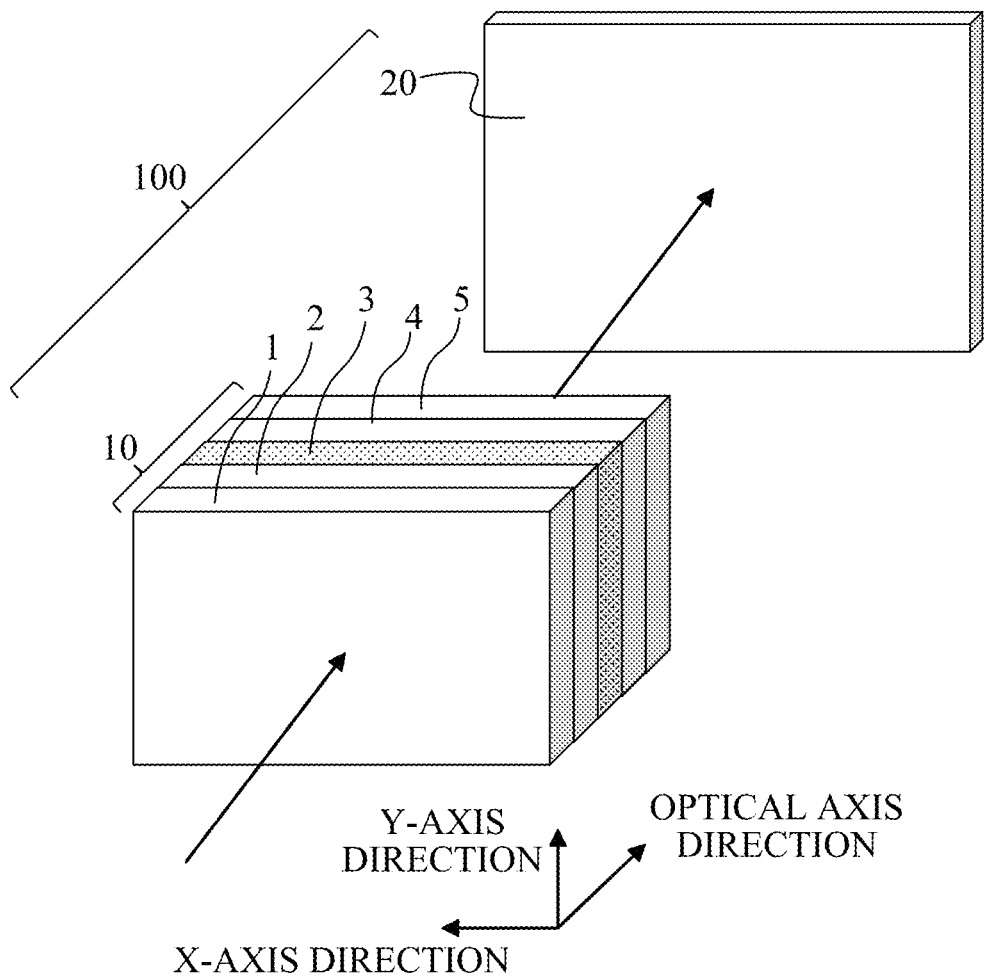
FIG. 1 illustrates a configuration of an optical low-pass filter according to one embodiment of the present invention.

FIG. 1 illustrates a configuration of an imaging apparatus 100 according to one embodiment of the present invention. The imaging apparatus 100 includes an unillustrated imaging optical system, an optical low-pass filter 10, and an image sensor 20 in order from an object side (front side in the figure). An optical image is formed on the image sensor 20 by a light beam that has passed through the imaging optical system and further passed through the optical low-pass filter 10. The image sensor 20 photoelectrically converts (captures) an optical image and generates an image signal. The optical low-pass filter 10 gives the imaging light a low-pass effect that restricts high-frequency optical image information equal to or higher than the Nyquist frequency by controlling the point image distribution formed by the imaging light.

The optical low-pass filter 10 includes, in order from an object side (light incident side) to an image side (image sensor side or light exit side), a birefringent optical element (first optical anisotropic element) 1, a birefringent optical element (second optical anisotropic element) 2, a retardation plate 3, a birefringent optical element (third optical anisotropic element) 4, and a birefringent optical element (fourth optical anisotropic element) 5, which are layered in the light traveling direction. Each birefringent optical element as the optical anisotropic element separates an incident ray by its birefringence characteristic. On the other hand, the retardation plate 3 has the birefringence characteristic, but does not separate the ray and controls the polarization state of the ray. This embodiment realizes an optical low-pass characteristic by the combination of the first to fourth birefringent optical elements 1, 2, 4, and 5 and the retardation plate 3.

The first to fourth birefringent optical elements 1, 2, 4, and 5 and the retardation plate 3 is a plane-parallel plate with a rectangular shape having a long side and a short side (while part of the birefringent optical element may be notched so as to identify the front and back sides and the direction). In FIG. 1, a first direction (lateral direction) in which the long side of the image sensor 20 extends is set to an x-axis direction, and a second direction (longitudinal direction) in which the short side extends is set to a y-axis direction. In the image sensor 20, the x-axis direction and the y-axis direction are pixel arrangement directions, which coincide with the directions in which the long side and the short side of each birefringent optical element extend. In each birefringent optical element, the xy plane parallel to the x-axis and y-axis directions will be referred to as an element surface (optical surface). The x-axis direction and the y-axis direction coincide with the arrangement direction of the plurality of pixels in the image sensor 20. The direction orthogonal to the element surface will be referred to as the optical axis direction. The thickness of each birefringent layer and the retardation plate illustrated in FIG. 1 in the optical axis direction is actually about several hundreds of μm.

Figure 2A:
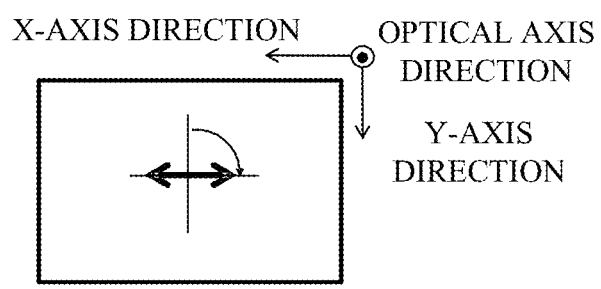
FIGS. 2A to 2D explain point image separation (ray separation) by birefringent optical elements according to this embodiment.
Figure 2B:
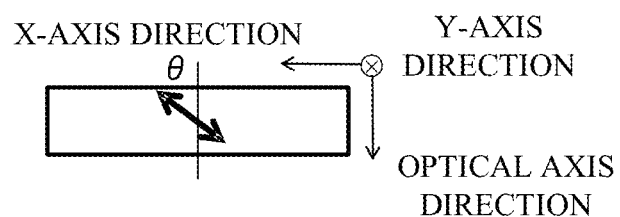

Each birefringent optical element (1, 2, 4, 5) is made of uniaxial crystal such as quartz and lithium niobate, and the optical axis of the uniaxial crystal inclines to the element surface as illustrated in FIGS. 2A and 2B. As illustrated in FIG. 2A, when the birefringent optical element is viewed from the optical axis direction, the optical axis of the uniaxial crystal faces an azimuth (or direction) that forms an angle of 90° relative to the y-axis direction. As illustrated in FIG. 2B, when the birefringent optical element is viewed from the y-axis direction, the optical axis of the uniaxial crystal inclines to the optical axis direction by an angle θ. In the following description, the angle θ will be referred to as an inclination angle. The inclination angle θ is generally set to around 45° or in the range of 10° to 80° depending on the material of the birefringent optical element and the phase difference to be set.

Figure 2C:
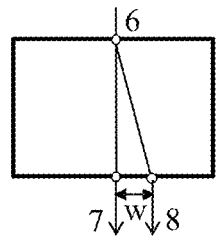
Figure 2D:
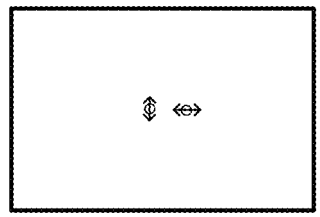

Thus, the ray incident on the birefringent optical element as a plane-parallel plate whose optical axis inclines to the element surface is separated into two rays, i.e., an ordinary ray and an extraordinary ray, as illustrated in FIGS. 2C and 2D. More specifically, as illustrated in FIG. 2C, a ray 6 incident on the birefringent optical element from the optical axis direction is separated into an ordinary ray 7 that passes straight through the birefringent optical element and an extraordinary ray 8 that obliquely passes through it. A separation direction (x-axis direction) of the ordinary ray 7 and the extraordinary ray 8 will be referred to as a ray separation direction.

The ordinary ray 7 is polarized light whose electric field oscillates in a direction orthogonal to the ray separation direction, and the extraordinary ray 8 is polarized light whose electric field oscillates in a direction parallel to the ray separation direction. In other words, the ordinary ray 7 and the extraordinary ray 8 are linearly polarized lights whose polarization directions are orthogonal to each other. A separation width w between the ordinary ray 7 and the extraordinary ray 8 in the ray separation direction (referred to as a ray separation width hereinafter) is uniquely determined based on a refractive index anisotropy $\Delta n$ inherent to the material of the birefringent optical element, and a tilt angle θ of the optical axis, and a thickness d of the birefringent optical element (plane-parallel plate). Thus, once the material of the birefringent layer and the tilt angle θ are determined, the ray separation width w is proportional to the thickness d.

By layering the birefringent optical elements, $2^N$ separated point images are formed for N layers. Basically, the birefringent optical elements are layered so that the ray separation direction forms an angle of about 45° or 135° as an absolute value. However, the birefringent optical elements before and after the retardation plate can be arranged with an arbitrary ray separation direction. The layered birefringent optical elements 1, 2, 4, and 5 serve as an optical low-pass filter 10 by setting based on the geometric optics theory the spread of the point image distribution in consideration of the ray separation direction, the ray separation width, and the number of layers.

The retardation plate 3 is made of uniaxial crystal or a stretched film or the like, and is disposed so that the optical axis (fast axis or slow axis) of the uniaxial crystal is parallel to the element surface. In FIG. 1, the retardation plate 3 is disposed between the birefringent optical elements 2 and 4. The retardation plate 3 is disposed so that its optical axis forms an angle of about 45° (absolute value) relative to the vibration directions of linearly polarized lights of a plurality of rays separated by the birefringent optical element 2. A polarization state of the ray that has transmitted through the retardation plate 3 is converted into that corresponding to the phase difference while the ray is not separated, and enters the birefringent optical element 4. Ideally, the ray that has passed through the retardation plate 3 is converted into circularly polarized light or depolarized, and the separated rays (point images) have the same intensities regardless of the ray separation direction of the birefringent optical element 4. However, the ideal state may shift due to the wavelength dependency of the phase difference of the retardation plate 3. In this case, the shift can be reduced by integrating the entire wavelength range.

FIGS. 3A to 3C illustrate a point image separation by the optical low-pass filter. These figures illustrate geometric point images formed when light passes through the birefringent optical elements 1 and 2, the retardation plate 3, and the birefringent optical elements 4 and 5 in this order. FIG. 3A illustrates the retardation plate 3 having a phase difference of an odd multiple of the wavelength $\lambda/4$, FIG. 3B illustrates its phase difference of a constant multiple of $\lambda$, and FIG. 3C illustrates its phase difference of an odd multiple of $\lambda/2$. Each single-sided arrow in these figures indicates the ray separation direction, and each double-sided arrow indicates the polarization direction of the ray (point image). The point image formed by the ordinary rays is indicated by a solid line, and the point image formed by the extraordinary rays is indicated by a dotted line.

As illustrated in FIG. 3A, when the phase difference of the retardation plate 3 is the odd multiple of $\lambda/4$, the light that has passed through the retardation plate 3 is converted into circularly polarized light and is separated into 16 points by the birefringent optical elements 4 and 5.

On the other hand, as illustrated in FIGS. 3B and 3C, when the phase difference of the retardation plate 3 is the constant multiple of $\lambda$ and the odd multiple of $\lambda/2$, the light emitted from the retardation plate 3 is linearly polarized light and the polarization direction is parallel or perpendicular to the ray separation direction of the birefringent optical element 4. Hence, the point image formed by the polarized light having the polarization direction parallel to the ray separation direction of the birefringent optical element 4 merely moves in the direction of the dotted arrow in the figures and the polarized light is not separated.

Thus, according to the phase difference of the retardation plate 3, the geometric point image distribution changes in order of 16 points (FIG. 3A), 8 horizontal points (FIG. 3B), and 8 vertical points (FIG. 3C). Where $\lambda$ is a wavelength of the ray and a phase difference of the retardation plate 3 is an odd multiple of $\lambda/4$, a constant multiple of $\lambda$, and an odd multiple of $\lambda/2$, the point image distributions illustrated in FIGS. 3B and 3C are superimposed with each other.

FIGS. 4A to 4C correspond to FIGS. 3A to 3C but change the ray separation directions of the birefringent optical elements 1, 2, 4 and 5 so that the ray separation directions of the birefringent optical elements 2 and 4 adjacent to the retardation plate 3 are the x-axis direction or the y-axis direction. In the following description, "45°" means "about 45°" that includes not only 45° but also an angle shifted from 45° by several degrees.

In this case, the optical axis of the retardation plate 3 faces the 45° direction, and the geometric point image distribution changes in order of 16 points (FIG. 4A), 8 points in the +45° diagonal direction (FIG. 4B), and 8 points in the −45° diagonal direction (FIG. 4C) according to the phase difference of the retardation plate 3.

Use of the retardation plate 3 improves the freedom degree of arrangement of the birefringent optical element in the ray separation direction, while the point image distribution varies depending on the wavelength due to the wavelength dependency of the depolarization effect of the retardation plate 3. In particular, in the multilayer optical low-pass filter described in this embodiment, the final point image distribution (behaviors of the point images) varies depending on the arrangement method of the birefringent optical elements 1, 2, 4, and 5 and the retardation plate 3. Under a general light source that emits light in a wide band, the influence of wavelength can be reduced by averaging. However, when the phase difference δ of the retardation plate 3 is 5 times or less of the use wavelength band Δλ, it is necessary to properly set a phase difference and an azimuth of the optical axis.

The point image obtained in the actual imaging environment is influenced by the spectrum of light that illuminates the object, the transmittance of the imaging optical system, the spectral sensitivity of the image sensor 20, and the transmittance of the color filter provided for each pixel in the image sensor 20.

Now assume that the imaging optical system and the illumination light have a flat spectrum. The uniformity or bias I of the point image distribution obtained in this case is expressed by the following expression (1) using a normalized spectral sensitivity spectrum $S(\lambda)$ defined by the sensitivity of the image sensor 20 and the color filter band width, and a function $f(\lambda)=\cos(2\pi/\lambda\cdot\delta(\lambda))$ that represents a behavior of the point images for the phase difference (spectral phase difference) $\delta(\lambda)$ of the retardation plate 3. The normalized spectral sensitivity spectrum $S(\lambda)$ has a minimum value of 0, and a maximum value of 1.

$$I = \int_{\lambda_{max}}^{\lambda_{min}} s(\lambda)\cdot\cos(2\pi/\lambda\cdot\delta(\lambda))d\lambda \qquad (1)$$

10% or more of the peak intensity of $S(\lambda)$ is set to an integration range, and $\lambda$max and $\lambda$min are the longest wavelength and the shortest wavelength of the integration range, respectively. The peak intensity is, for example, the peak intensity in the green band.

Figure 5:
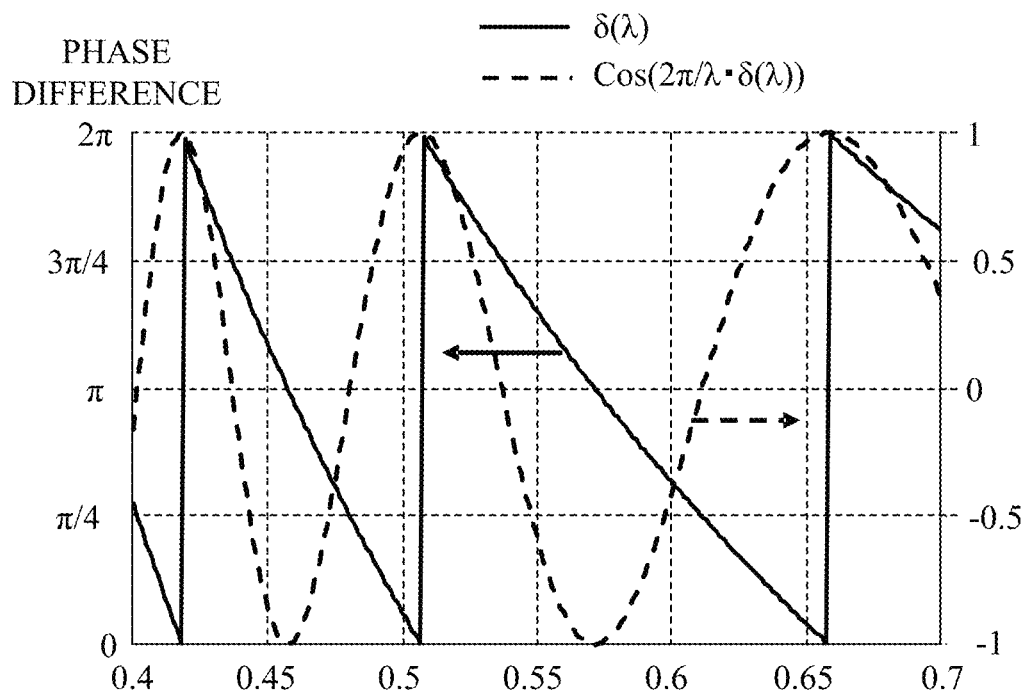
FIG. 5 illustrates a spectral characteristic of a phase difference $\sigma(\lambda)$ and a function $f(\lambda)$ of a retardation plate according to this embodiment.

FIG. 5 illustrates a relationship between the phase difference $\delta(\lambda)$ of the retardation plate and the function $f(\lambda)$. The function $f(\lambda)$ becomes 0 when $\delta(\lambda)=(2m+1)\lambda/4$ (m is an integer), becomes 1 when $\delta(\lambda)=m\lambda$, and becomes −1 when $\delta(\lambda)=(2m+1)\lambda$.

Figure 6:
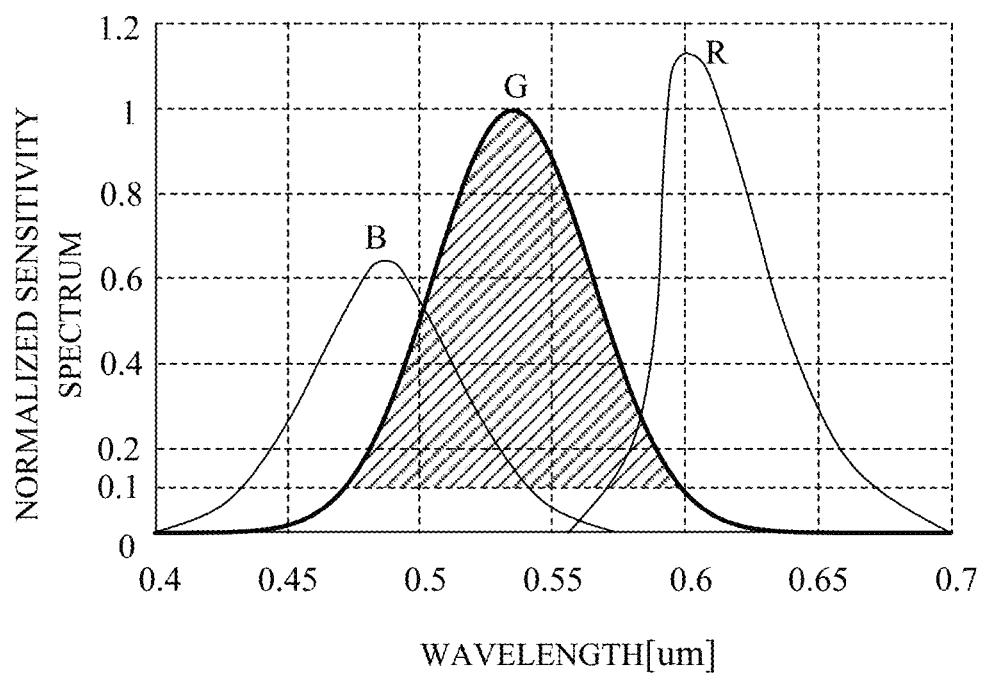
FIG. 6 illustrates an illustrative spectral sensitivity spectrum $S(\lambda)$ according to this embodiment.

FIG. 6 illustrates normalized sensitivity spectra for color filters in the red band (R), green band (G), and blue band (B)

as an example of the normalized sensitivity spectrum S(λ) of the image sensor 20. It illustrates a range of 10% or more of the peak intensity of S(λ) in the green band by hatching. While this figure sets the maximum value to 1, the calculation of the expression (1) needs a division by the integral value of S(λ) for the normalization. In the actual calculation or measurement that handles data with discrete wavelength division numbers (such as every 1 nm or 10 nm), I is calculated by normalizing the sum of the product of the function f(λ) and the normalized sensitivity spectrum S(λ) by the sum of S(λ).

The expression (1) corresponds to the function f(λ) integrated in a wavelength range λmax to λmin and normalized in consideration of the weight of S(λ), and represents a bias of the point image distribution where the sensor sensitivity is considered. When I is the maximum value of 1 or the minimum value of −1, the point image is separated into 8 points, and when I is 0, the point image is separated into the most uniform 16 points. Thus, when I is 0 or close to 0, the point image distribution is uniform. More specifically, I may fall within a range of −0.20 to +0.20, or the following expression may be satisfied:

$$-0.20 \le I \le 0.20 \quad (2)$$

I may fall within a range of −0.10 to +0.10, or the following expression may be satisfied:

$$-0.10 \le I \le 0.10 \quad (2)'$$

Since the spectral sensitivity spectrum S(λ) is a known fixed value in the expression (1), the expression (1) indicates a condition used to set the phase difference δ(λ) of the retardation plate 3 so as to obtain a desired point image distribution.

FIGS. 7A and 7B illustrate a point image distribution averaged over wavelengths from 460 nm to 640 nm in the configuration illustrated in FIGS. 3A to 3C (while Table 1 shows specific numerical examples) and the MTFs on sections in the x-axis, y-axis, and ±45° (diagonal) directions. FIGS. 8A and 8B illustrate a point image distribution averaged over wavelengths from 460 nm to 640 nm in the configuration illustrated in FIGS. 4A to 4C (while Table 2 shows specific numerical examples) and the MTFs on sections in the x-axis, y-axis, and ±45° (diagonal) directions. In these configurations, I falls within a range of ±0.10. It is to be understood that a uniform point image distribution is obtained in both cases by properly setting the phase difference.

FIGS. 9A, 9B, 10A, and 10B illustrate point image distributions outside the numerical range of the expression (2) formed by the configuration as a comparative example of this embodiment (while Tables 3 and 4 show specific numerical examples). FIGS. 7A, 7B, 8A, and 8B differ from FIGS. 9A, 9B, 10A, and 10B in thickness of the retardation plate 3. Since the point image intensity varies in the x-axis and y-axis directions in FIGS. 9A and 9B, stable MTF characteristics are obtained in the ±45° directions, but the MTF fluctuation amount will increase in the x-axis and y-axis directions.

On the other hand, in FIGS. 10A and 10B, stable MTF characteristics are obtained in the x-axis and y-axis directions, but the MTF fluctuation amount will increase in the ±45° directions.

Herein, I is equal to or smaller than the lower limit value of the expression (2) (and the expression (2)'), but the above description is equivalently applied when it is larger than the upper limit value, except that the relationship between the x-axis direction and the y-axis direction or the ±45° direction is reversed. When I exceeds the numerical range of the expression (2) (within ±0.20), the MTF fluctuation increases in a specific direction and thus I may be maintained within the above numerical range.

When I does not satisfy the ideal condition expressed by the expression (2) due to the phase difference variation caused by manufacturing tolerances of the retardation plate 3, the design value of the retardation plate 3 needs to be determined based on the bias of the point image distribution. In the optical low-pass filter 10 used in the imaging apparatus 100 according to this embodiment, the birefringent optical elements may be arranged so as to obtain stable characteristics in order to stably suppress the false color while a resolution sense is left in the ±45° directions, as illustrated in FIGS. 9A and 9B.

More specifically, as illustrated in FIGS. 3A to 3C, the retardation plate 3 may be disposed so that its slow axis or fast axis azimuth (or direction) is in the x-axis and y-axis directions, and the ray separation directions of the birefringent optical elements 2 and 4 adjacent to the retardation plate 3 forms an angle of 45° or 135° relative to the x-axis and y-axis directions. On the contrary, in improving the resolution stability in the x-axis and y-axis directions, the retardation plate 3 may be disposed so that its slow axis or fast axis azimuth is in the ±45° directions as illustrated in FIGS. 4A to 4C.

A description will now be given of the configuration illustrated in FIGS. 3A to 3C, where the priority is given to the resolution of the y component or the MTF in the x-axis direction. The bias of the point image distribution depends on the phase difference of the retardation plate 3 and the ray separation directions of the birefringent optical elements 2 and 4 adjacent to the retardation plate 3 in the configurations in FIGS. 3A to 3C. For example, in FIG. 3B, the composite vector in the ray separation directions of the birefringent optical elements 2 and 4 faces the x-axis direction, and the final point image is separated into 8 lateral points. If the ray separation direction of the birefringent optical element 4 is inverted by 180°, the composite vector faces the y-axis direction, and the point image is separated into 8 vertical points. Therefore, in making the point image distribution close to 8 vertical points in consideration of the tolerance of the retardation plate 3, the numerical value range of I to be set depends on the phase difference of the retardation plate 3 and the ray separation direction of the birefringent optical element adjacent to the retardation plate 3. In other words, where the composite vector in the ray separation direction of the birefringent optical element adjacent to the retardation plate 3 is parallel to the x-axis direction, I may satisfy the following condition.

$$-0.10 \le I \le 0.20 \quad (3)$$

If the composite vector is parallel to the y-axis direction, I may satisfy the following condition.

$$-0.20 \le I \le 0.10 \quad (4)$$

The optical low-pass filter having a target characteristic is available by considering the tolerance of the retardation plate 3 and by introducing I into the range of the expression (3) or (4), while the fluctuation of the point image distribution is expected to some extent.

This embodiment has hitherto described the case where the ray separation widths of the birefringent optical elements 1, 2, 4 and 5 are equal to each other, but they may have different ray separation widths. For example, in Example 3 described later, ray separation widths Dp and Dn in the ±45° directions are set smaller than ray separation widths w in the x-axis and y-axis directions (referred to as Dx and Dy hereinafter, respectively). In Example 4 described later, the ray separation widths Dp and Dn in the ±45° directions are set larger than the ray separation widths Dx and Dy in the x-axis and y-axis directions. Thereby, both high-frequency folding moiré and high-frequency false colors in the ±45° directions can be suppressed. More specifically, the condition of Dx<Dp and Dy<Dn or the condition of Dx<Dp, Dx<Dn, Dy<Dp, and Dy<Dn may be satisfied. When at least one of these two conditions is satisfied, the same effect as described above can be expected. Four or more birefringent optical elements may be layered, whereby the point image distribution becomes closer to a Gaussian shape, and folding of the high-frequency domain is more stably suppressed.

Quartz, sapphire, lithium niobate, and the like are generally used for a material for the birefringent optical element, but another birefringent material may be used and a film structural birefringence produced by controlling the alignment of the liquid crystal may be used. It is not always necessary to use the same birefringent material for the entire optical low-pass filter, and a birefringent material may be selected for each birefringent optical element. For example, when birefringent optical elements having different thicknesses are used, the thickness of the entire optical low-pass filter can be reduced and a material cost can be reduced by using lithium niobate for wider ray separation widths Dp and Dn and by using quartz for narrower ray separation widths Dx and Dy. Although the different phase difference derived from the birefringent optical element may affect the point image due to the material difference, the influence can be mitigated by maintaining the ray separation widths and the material symmetry of the birefringent optical elements 2 and 4 adjacent to the retardation plate 3 as illustrated in FIGS. 3A to 3C.

An arbitrary material can be used for the retardation plate 3. A stretched film type can be made thinner and the thickness of the entire optical low-pass filter can be reduced. An inorganic material may be used when there is a concern about durability or deterioration over time. It may use a material similar to that of the birefringent optical element such as quartz and having a different optical axis angle. In this case, the thickness of the birefringent optical element may be 0.3 mm or less. If the thickness is 0.1 mm or less, the condition of the expression (2) may not be satisfied when the tolerance is considered and thus the thickness may be 0.1 mm or more and 0.3 mm or less.

A plurality of birefringent optical elements and retardation plate may be arranged separately from each other on the optical path, or part or whole of them may be joined (layered). The birefringent optical element may have another application, such as using the birefringent optical element closest to the image side (image sensor side or light exit side) for the cover glass, or disposing an isotropic member (e.g., a translucent substrate or colored glass) between the birefringent optical elements, and adding a dust removing vibrator to the birefringent element closest to the object), or the birefringent optical elements and the retardation plate may be mixed with a member for a function different from the optical low-pass filter.

The description has hitherto been given of the sensitivity spectrum in the green band (such as 520 to 570 nm) of the image sensor, but the embodiment is applicable to the red band (such as 600 to 650 nm) and the blue band (such as 450 to 500 nm). It may be confirmed whether or not the calculation result of the expression (1) for the sensitivity spectrum of each color band rather than a combined value of the sensitivity spectrum of green, red and blue bands satisfies the numerical value range of the expression (2) or (2)'. While the expression (1) sets the integration wavelength range to the visible wavelength range from 460 nm to 640 nm, when the sensitivity in the ultraviolet region or the infrared region is utilized, the integration wavelength range may be expanded to those wavelength regions.

More strictly, $S(\lambda)$ is weighted by not only the sensitivity of the image sensor 20 and the transmittance of the color filter but also the spectral transmittances of the various optical elements disposed on the optical path from the object to the image sensor 20. Hence, $S(\lambda)$ may be multiplied by the characteristics of these optical elements.

The embodiment according to the present invention includes any optical low-pass filters having the following configurations: The optical low-pass filter has four or more optical anisotropic elements. The four or more optical anisotropic elements include one or more first optical anisotropic elements that separate the ray in the x-axis direction, one or more second anisotropic optical elements that separate the ray in the y-axis direction, one or more third optical anisotropic elements that separate the ray in a direction that forms an angle of +45° or −45° relative to the x-axis direction, and one or more fourth optical anisotropic elements that separate the ray in a direction that forms an angle of +45° or −45° relative to the y-axis direction.

The number of optical anisotropic elements may be five or more, and the number of retardation plates may be two or more. However, in order to reduce the thickness of the optical low-pass filter, there may be four optical anisotropic elements and one retardation plate. An optical low-pass filter may include four layered birefringent optical elements without using any retardation plates. Also in this case, the first and fourth birefringent optical elements may be made of quartz, and the second and third birefringent optical elements may be made of lithium niobate. The retardation plate can be located between the two optical anisotropic elements adjacent to each other as well as at the central layer. For easy separations of the point images or easy design, the retardation plate may be located at the central layer.

The angle between the ray separation directions of the two optical anisotropic elements adjacent to each other among the four or more optical anisotropic elements may be 120° or more and 150° or less.

A description will now be given of a configuration of the optical low-pass filter 10 according to a more specific example (numerical example).

EXAMPLE 1

Table 1 illustrates a configuration of an optical low-pass filter according to Example 1. The optical low-pass filter according to this example includes a birefringent optical element 1 (LPF1), a birefringent optical element 2 (LPF2), a retardation plate 3, a birefringent optical element 4 (LPF3), and a birefringent optical element 5 (LPF4), which are made of quartz and are layered in this order from the light incident side to the light exit side. The ray separation directions of the birefringent optical elements 1, 2, 4, and 5 are 180°, +45°, 315° (−45°), and 90°, respectively, relative to the x-axis direction. All of the birefringent optical elements 1, 2, 4 and 5 have the ray separation widths of 2.1 µm and the thicknesses of 350 µm. The retardation plate 3 is disposed so that its slow axis extends parallel to the y-axis direction, and changes the polarization state of the light from the birefringent optical element 2.

FIG. 5 illustrates a relationship between the phase difference $\delta(\lambda)$ of the retardation plate 3 and the function $f(\lambda)$ according to this example. The lower part in Table 1 shows the value of I in the expression (1) in this example. I=−0.01 indicating the bias of the point image distribution is small enough to satisfy the conditions of the expressions (2) and (2)'.

FIGS. 7A and 7B illustrate a phase difference distribution of the point image and the MTF according to this example. The point image distribution is obtained by integrating with the weight of the normalized spectral sensitivity spectrum illustrated in FIG. 5 in the wavelength range of 460 nm to 640 nm. A uniform point image distribution and the MTF are obtained in the x-axis, y-axis, and ±45° directions.

Table 2 shows a configuration of an optical low-pass filter according to Comparative Example 1. Comparative Example 1 is different from Example 1 in thickness (phase difference) of the retardation plate, and I in the expression (1) is −0.23, which does not satisfy the condition of the expression (2). FIGS. 9A and 9B illustrate a point image intensity distribution and the MTF according to this comparative example, respectively. The point image distribution according to this comparative example has remaining bias part after the wavelength integration, and thereby the MTF in the y-axis direction is generally low. Moreover, the point image distribution has a locally high intensity, and the MTF suppression effect of the high-frequency domain of 200 lp/mm or higher is not enough. As a result, color moiré may increase in a specific direction or high-frequency folding moiré may occur.

On the other hand, the configuration according to this example can make uniform the point image distribution, and provide the optical low-pass filter having the stable characteristic.

Table 3 shows a configuration of an optical low-pass filter as a variation (Example 1') of this example. This variation is different from Table 1 in that the ray separation directions of the birefringent optical elements (LPF2, LPF3) adjacent to the retardation plate 3 and the birefringent optical elements (LPF1, LPF4) closest to the light incident side and the light exit side. More specifically, the ray separation directions of the birefringent optical elements 1, 2, 4, and 5 form angles of +45°, 180°, 90°, and 315° (−45°) relative to the x-axis direction, respectively. All of the birefringent optical elements 1, 2, 4 and 5 have the ray separation widths of 2.1 μm and the thicknesses of 350 μm.

This variation is different from Table 1 in change of the point image distribution for each wavelength, but properly setting the phase difference of the retardation plate 3 can provide I=−0.01 that satisfies the conditions of the expressions (2) and (2)' and the point image distribution and the MTF illustrated in FIGS. 8A and 8B. As a result, the characteristic of the optical low-pass filter equivalent to that illustrated in FIGS. 7A and 7B can be obtained particularly in the low-frequency domain.

EXAMPLE 2

Table 4 shows a configuration of an optical low-pass filter according to Example 2. The optical low-pass filter according to this example includes a birefringent optical element 1 (LPF1) made of quartz, a birefringent optical element 2 (LPF2) made of lithium niobate, a retardation plate 3 made of quartz, and a birefringent optical element 4 (LPF3) made of lithium niobate, and a birefringent optical element 5 (LPF4) made of quartz, which are layered in this order from the light incident side to the light exit side.

The ray separation directions of the birefringent optical elements 1, 2, 4, and 5 form angles of 180°, +45°, 315°

(−45°), and 90°, respectively, relative to the x-axis direction. Each of the birefringent optical elements 1 and 5 has the ray separation width of 2.3 μm and the thickness of 400 μm, and each of the birefringent optical elements 2 and 4 has the ray separation width of 4.1 μm and the thickness of 200 μm. In other words, the ray separation widths Dp and Dn in the ±45° directions are wider than the ray separation widths Dx and Dy in the x-axis and y-axis directions. The retardation plate 3 is disposed so that its slow axis extends parallel to the y-axis direction, and changes the polarization state of the light from the birefringent optical element 2.

Figures 11B, 11G, 11R:
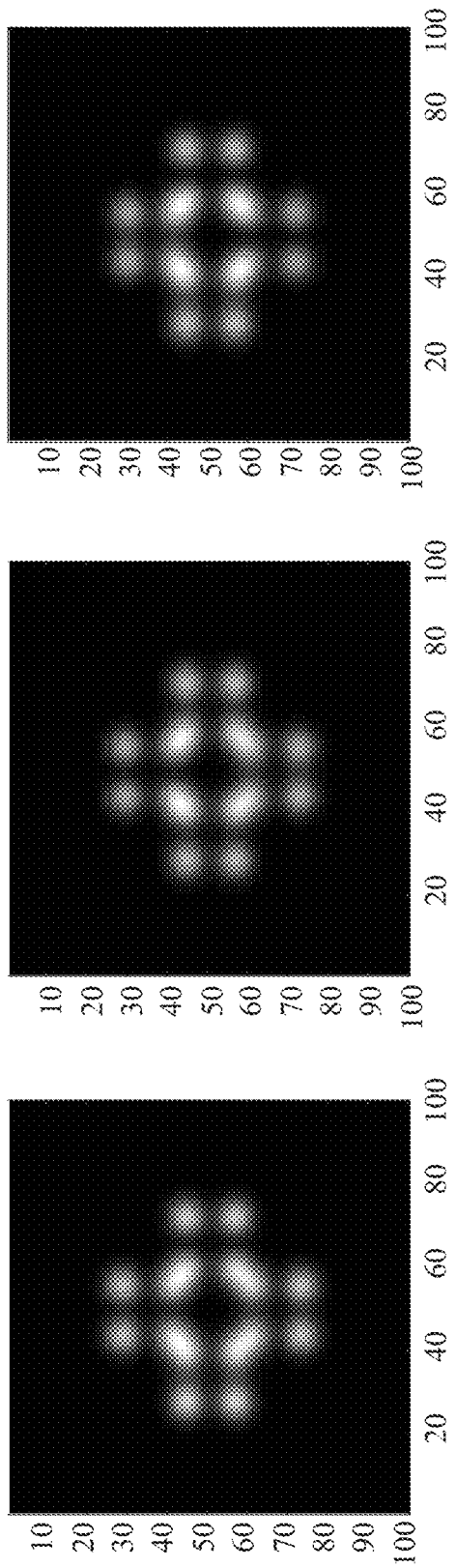
FIGS. 11B, 11G, and 11R illustrate a point image distribution formed by the optical low-pass filter according to Example 2.

FIGS. 11R, 11G, and 11B illustrate point image distributions according to this example. The point image distributions in FIGS. 11R, 11G, and 11B illustrate the wavelength integration results using spectral sensitivity spectra $S(\lambda)$ based on the red band, green band, and blue band color filters, respectively. The spectral sensitivity spectra $S(\lambda)$ of the red band and the blue band are obtained by changing the peak sensitivity wavelength of the green band illustrated in FIG. 6 to 460 nm and 600 nm, respectively. It is understood from FIGS. 11R, 11G and 11B that 16 uniformly separated point images are obtained for each color band. At a lower portion in Table 4, I values (−0.082, −0.019, −0.1033) of the expression (1) in the red band, the green band, and the blue band according to this example are small enough to satisfy the conditions in the expression (2) and (2)'.

Figures 12B, 12G, 12R:
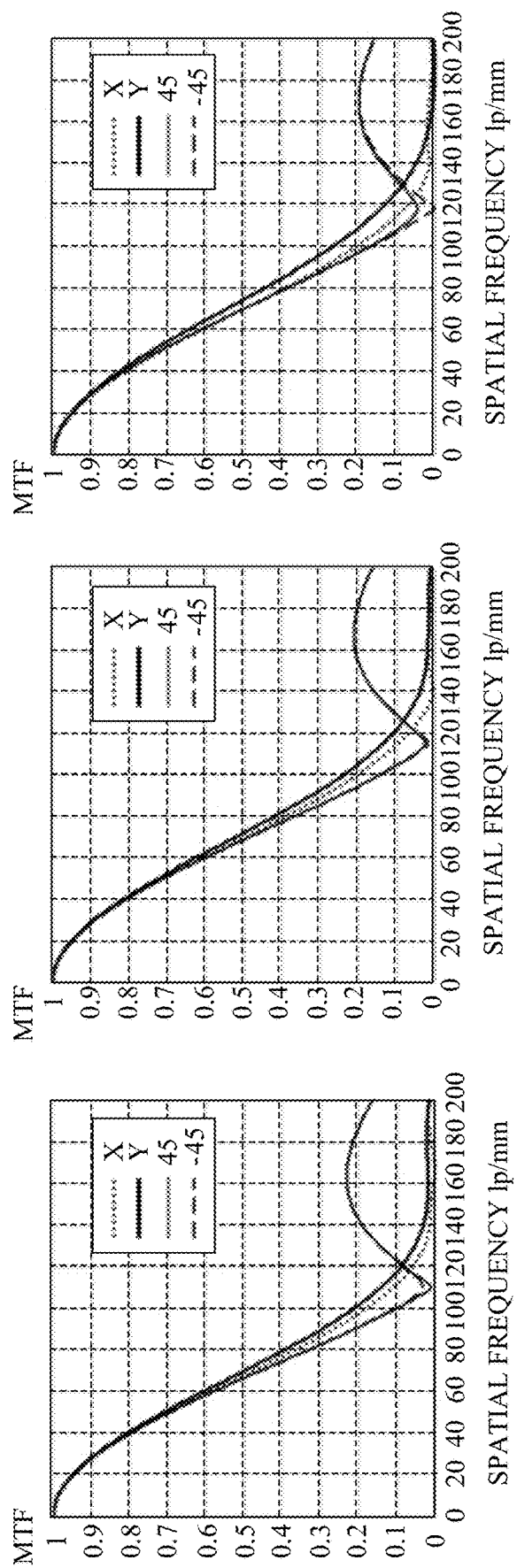
FIGS. 12B, 12G, and 12R illustrate a spatial frequency characteristic of the optical low-pass filter according to Example 2.

FIGS. 12R, 12G and 12B illustrate the MTFs for the point image distributions illustrated in FIGS. 11R, 11G and 11B. Each figure characteristically illustrates that the MTF gradually decreases toward the high-frequency side in the x-axis and y-axis directions, and removes folding in the high-frequency band. In the ±45° directions, the false color is suppressed by reducing the frequency band characteristic of 110 p/mm and the folding moiré is suppressed by suppressing the folding of the higher frequency band.

TABLE 1

| EXAMPLE 1 | Material | Separation width [um] | Separation direction/Slow axis direction | Optical axis tilt angle | Thickness [um] |
|---|---|---|---|---|---|
| LPF1 | Quartz | 2.08 | 180° | 45° | 350 |
| LPF2 | Quartz | 2.08 | 45° | 45° | 350 |
| Retardation Plate | Quartz | — | 90° | 90° | 220 |
| LPF3 | Quartz | 2.08 | 315° | 45° | 350 |
| LPF4 | Quartz | 2.08 | 90° | 45° | 350 |
| Conditional expression (1) | −0.01 | | | | |

TABLE 2

| Comparative Example 1 | Material | Separation width [um] | Separation direction/Slow axis direction | Optical axis tilt angle | Thickness [um] |
|---|---|---|---|---|---|
| LPF1 | Quartz | 2.08 | 180° | 45° | 350 |
| LPF2 | Quartz | 2.08 | 45° | 45° | 350 |
| Retardation Plate | Quartz | — | 90° | 90° | 209 |
| LPF3 | Quartz | 2.08 | 315° | 45° | 350 |
| LPF4 | Quartz | 2.08 | 90° | 45° | 350 |
| Conditional expression (1) | −0.23 | | | | |

TABLE 3

| EXAMPLE 1' | Material | Separation width [um] | Separation direction/Slow axis direction | Optical axis tilt angle | Thickness [um] |
|---|---|---|---|---|---|
| LPF1 | Quartz | 2.08 | 45° | 45° | 350 |
| LPF2 | Quartz | 2.08 | 180° | 45° | 350 |
| Retardation Plate | Quartz | — | 45° | 90° | 220 |
| LPF3 | Quartz | 2.08 | 90° | 45° | 350 |
| LPF4 | Quartz | 2.08 | 315° | 45° | 350 |
| Conditional expression (1) | −0.01 | | | | |

TABLE 4

| EXAMPLE 2 | Material | Separation width [um] | Separation direction/Slow axis direction | Optical axis tilt angle | Thickness [um] |
|---|---|---|---|---|---|
| LPF1 | Quartz | 2.3 | 180° | 45° | 400 |
| LPF2 | LiNbO3 | 4.1 | 45° | 73° | 200 |
| Retardation Plate | Quartz | — | 90° | 90° | 218 |
| LPF3 | LiNbO3 | 4.1 | 315° | 73° | 200 |
| LPF4 | Quartz | 2.3 | 90° | 45° | 400 |

| | Conditional expression (1) | λmin | λmax |
|---|---|---|---|
| r | −0.082 | 520 | 670 |
| g | −0.019 | 450 | 610 |
| b | −0.033 | 410 | 530 |

EXAMPLE 3

Table 5 shows a configuration of an optical low-pass filter according to Example 3 of the present invention. The optical low-pass filter according to this example includes a first birefringent optical element 1 made of quartz, a second birefringent optical element 2 made of lithium niobate, a retardation plate 3, a third birefringent optical elements 4 made of lithium niobite, and a fourth birefringent optical element 5 made of quartz, which are layered in this order. Each of the first birefringent optical element 1 closest to the light incident side and the fourth birefringent optical element 5 closest to the light exit side is made of quartz so as to mechanically protect the second and third birefringence optical elements 2 and 4 made of lithium niobate and disposed between them.

As shown in Table 5, the ray separation directions of the first to fourth birefringent optical elements 1, 2, 4 and 5 form angles of +45°, 180°, 90°, and 135°, respectively, relative to the x-axis direction. In other words, the azimuth difference between the optical axes of the first and second birefringent optical elements 1 and 2 is 135°, and the azimuth difference between the optical axes of the third and fourth birefringent optical elements 4 and 5 is 45°.

The ray separation widths w are 2.08 µm for quartz and 4.3 µm for lithium niobate. The thicknesses of the first to fourth birefringent optical elements 1, 2, 4 and 5 in the optical axis direction are 350 µm for quartz and 200 µm for lithium niobate which is thinner.

The retardation plate 3 has an slow axis azimuth that forms an angle of 45° relative to the x-axis direction, converts the polarization state of light from the second birefringent optical element 2 into circularly polarized light, and makes the separated rays (point images) have the same intensities regardless of the ray separation direction of the third birefringent optical element 4. The retardation plate 3 has a thickness of 220 µm.

Figure 13:
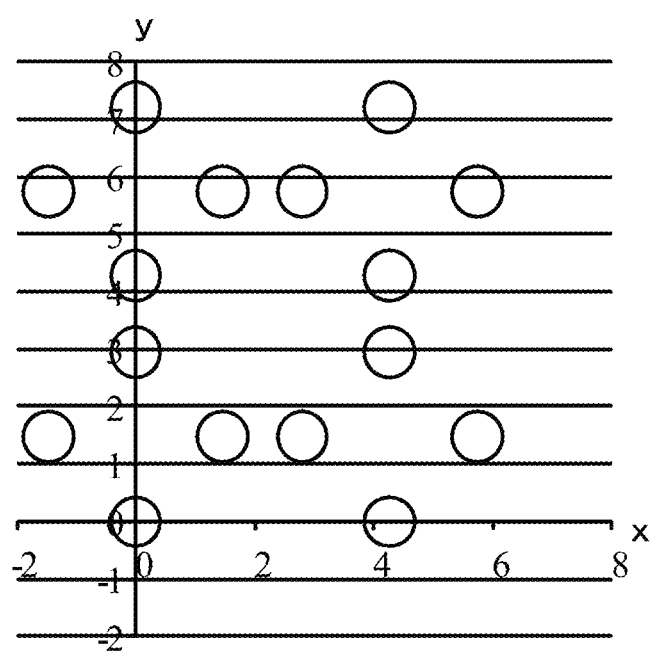
FIG. 13 illustrates a point image distribution formed by the ray separated by the optical low-pass filter according to Example 3.
Figure 14A:
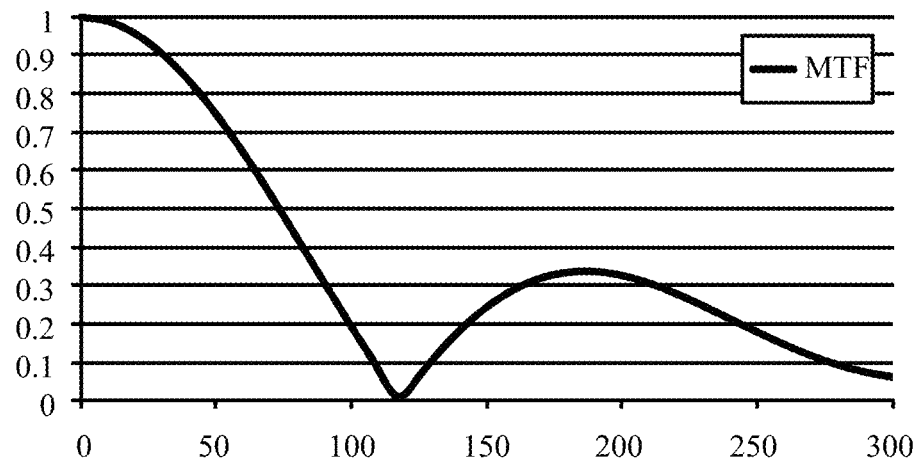
FIGS. 14A and 14B are graphs illustrating spatial frequency characteristics of the MTF of the optical low-pass filter according to Example 3.
Figure 14B:
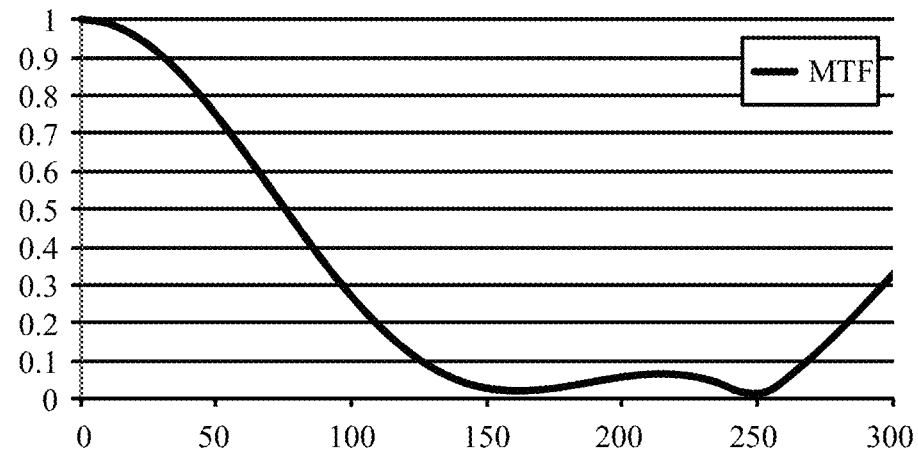

FIG. 13 illustrates a point image distribution formed by rays that have passed through the optical low-pass filter according to Example 3. One incident ray on the optical low-pass filter is separated into 16 exit rays by the optical low-pass filter, and the 16 exit rays form 16 point images on the image sensor 20. FIGS. 14A and 14B illustrate the spatial frequency characteristic of the MTF of the optical low-pass filter according to Example 3. FIG. 14A illustrates the MTF in the x-axis and y-axis (vertical and horizontal) directions, and FIG. 14B illustrates the MTF in directions oblique to the vertical and horizontal directions.

As illustrated in FIG. 13, the 16 point images distribute in a shape of a regular octagon slightly closer to a square. This is because the ray separations width in the vertical and horizontal directions are larger than the ray separation widths in the diagonal direction, and the optical low-pass filter effect is stronger in the vertical and horizontal directions than that in the diagonal directions. According to the MTF in FIGS. 14A and 14B, the cutoff frequency is lower in the vertical and horizontal directions than that in the diagonal directions. Thereby, both the color moiré in the oblique directions and the luminance moiré in the vertical and horizontal directions can be reduced.

EXAMPLE 4

Table 6 shows a configuration of an optical low-pass filter according to Example 4 of the present invention. Similarly to Example 3, the optical low-pass filter according to this example includes a first birefringent optical element 1 made of quartz, a second birefringent optical element 2 made of lithium niobate, a retardation plate 3, a third birefringent optical element 4 made of lithium niobite, and a fourth birefringent optical element 5 made of quartz, which are layered in this order. Each of the first birefringent optical element 1 closest to the light incident side and the fourth birefringent optical element 5 closest to the light exit side is made of quartz so as to mechanically protect the second and third birefringence optical elements 2 and 4 made of lithium niobate and disposed between them.

As shown in Table 6, the ray separation directions of the first to fourth birefringent optical elements 1, 2, 4 and 5 form angles of 180°, +45°, 315° (−45°), and 90° relative to the x-axis direction, respectively. The ray separation widths w are 2.3 µm for quartz and 4.3 µm for lithium niobate. The thickness of the first to fourth birefringent optical elements 1, 2, 4 and 5 in the optical axis direction is 400 µm for quartz, and 200 µm for lithium niobate, which is thinner.

The retardation plate 3 has a slow axis azimuth that has a slope of 90° to the x-axis direction, and converts the polarization state of the light from the second birefringent optical element 2 into circularly polarized light. Thereby, the separated rays (point images) have the same intensities regardless of the ray separation direction of the third birefringent optical element 4. The retardation plate 3 has a thickness of 218 µm.

Figure 15:
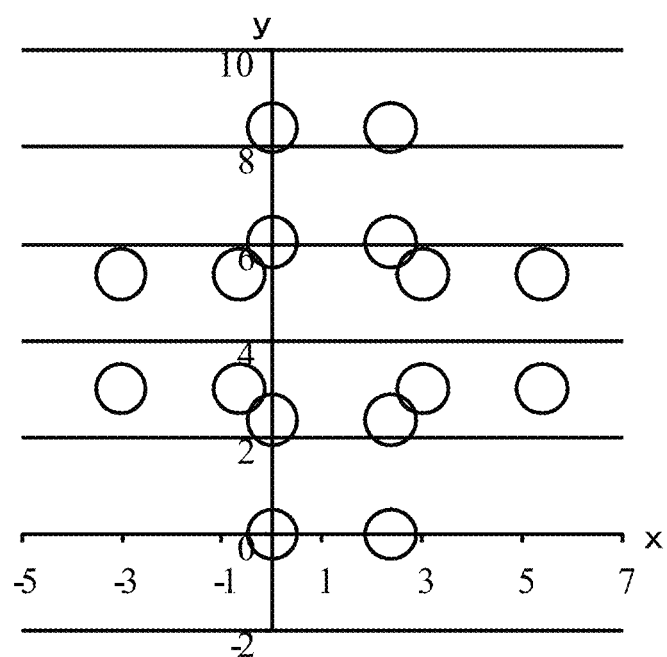
FIG. 15 illustrates a point image distribution formed by the ray separated by the optical low-pass filter according to Example 4.
Figure 16A:
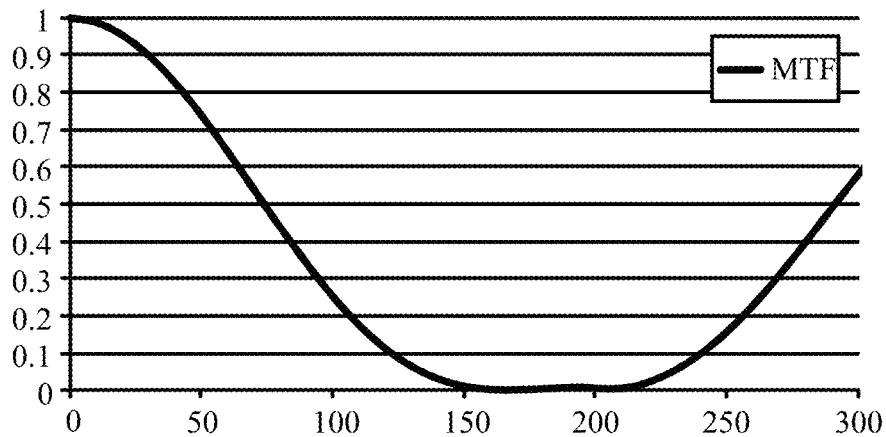
FIGS. 16A and 16B are graphs illustrating spatial frequency characteristics of the MTF of the optical low-pass filter of Example 4.
Figure 16B:
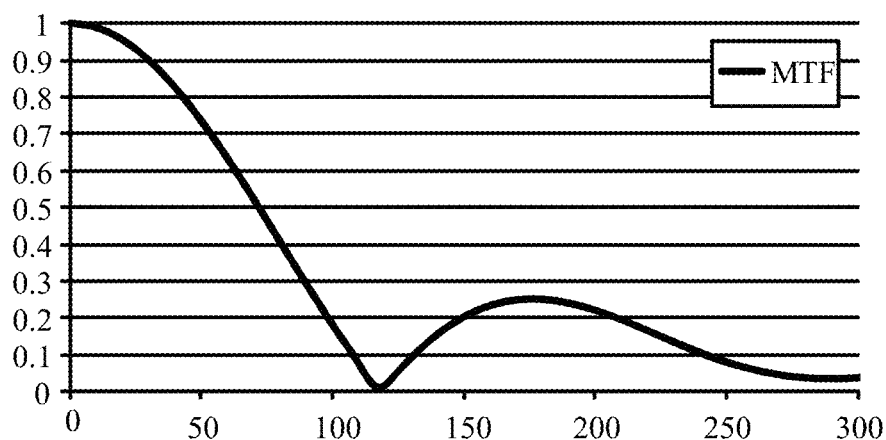

FIG. 15 illustrates a point image distribution formed by the rays that have passed through the optical low-pass filter according to Example 4. One ray incident on the optical low-pass filter is separated into 16 rays by the optical low-pass filter and forms 16 point images. FIGS. 16A and 16B illustrate the spatial frequency characteristic of the MTF of the optical low-pass filter according to Example 4. FIG. 16A illustrates the MTF in the x-axis and y-axis (vertical and horizontal) directions, and FIG. 16B illustrates the MTF in directions oblique to the vertical and horizontal directions.

As illustrated in FIG. 15, 16 point images distribute so as to form a cross. This is because the ray separation widths in the oblique directions are larger than the ray separation widths in the vertical and horizontal directions, and the optical low-pass filter effect is stronger in the diagonal directions than that in the vertical and horizontal directions. In the MTF in FIGS. 16A and 16B, the cutoff frequency is lower in the diagonal directions than that in the vertical and horizontal directions. Thereby, the luminance moiré is allowed in the vertical and horizontal directions and the color moiré that causes the false color can be reduced in the oblique directions.

TABLE 5

| EXAMPLE 3 | Material | Separation Width [um] | Separation direction/Slow axis direction | Optical axis tilt angle | Thickness [um] |
|---|---|---|---|---|---|
| LPF1 | Quartz | 2.08 | 45° | 45° | 350 |
| LPF2 | LiNbO3 | 4.3 | 180° | 73° | 200 |
| Retardation plate | Quartz | — | 45° | 90° | 220 |
| LPF3 | LiNbO3 | 4.3 | 90° | 73° | 200 |
| LPF4 | Quartz | 2.08 | 135° | 45° | 350 |

TABLE 6

| EXAMPLE 4 | Material | Separation Width [um] | Separation direction/Slow axis direction | Optical axis tilt angle | Thickness [um] |
|---|---|---|---|---|---|
| LPF1 | Quartz | 2.3 | 180° | 45° | 400 |
| LPF2 | LiNbO3 | 4.3 | 45° | 73° | 200 |
| Retardation plate | Quartz | — | 90° | 90° | 218 |
| LPF3 | LiNbO3 | 4.3 | 315° | 73° | 200 |
| LPF4 | Quartz | 2.3 | 90° | 45° | 400 |

Examples 1 and 2 described above can realize an imaging apparatus using an optical low-pass filter that has a high freedom degree of arrangement of optical anisotropic elements and has a stable characteristic.

Examples 3 and 4 can realize a thin and strong optical low-pass filter using four or more layered optical anisotropic elements.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefits of Japanese Patent Application No. 2019-003137, filed on Jan. 11, 2019 and Japanese Patent Application No. 2019-031285, filed on Feb. 25, 2019, each of which is hereby incorporated by reference herein in their entirety.

What is claimed is:

1. An imaging apparatus comprising:
an optical low-pass filter that includes first, second, third, and fourth optical anisotropic elements each configured to separate an incident ray into a plurality of rays, and a retardation plate disposed between two optical anisotropic elements adjacent to each other among the first to fourth optical anisotropic elements; and
an image sensor configured to photoelectrically convert an optical image formed by light that has passed the optical low-pass filter,
wherein the following condition is satisfied:

$-0.20 \leq I \leq 0.20$ $$I = \int_{\lambda_{max}}^{\lambda_{min}} s(\lambda) \cdot \cos(2\pi/\lambda \cdot \delta(\lambda)) d\lambda$$

where $\lambda$ is a wavelength of the light, $\delta(\lambda)$ is a phase difference of the retardation plate, $S(\lambda)$ is a normalized spectral sensitivity spectrum of the image sensor, and $\lambda$max and $\lambda$min are the longest wavelength and the shortest wavelength in an integration range that is 10% or more of a peak intensity of the $S(\lambda)$, respectively.

2. The imaging apparatus according to claim 1, wherein the peak intensity is a peak intensity in a green band of the light.

3. The imaging apparatus according to claim 1, wherein the image sensor includes a plurality of pixels arranged in a first direction and a second direction orthogonal to each other, and
wherein the first optical anisotropic element separates the ray in the first direction, the second optical anisotropic element separates the ray in the second direction, the third optical anisotropic element separates the ray in a direction that forms an angle of 45° relative to the first direction, and the fourth optical anisotropic element separates the ray in a direction that forms an angle of 45° relative to the second direction.

4. The imaging apparatus according to claim 1, wherein a ray separation width by the third optical anisotropic element is wider than that by the first optical anisotropic element.

5. The imaging apparatus according to claim 1, wherein a ray separation width by the fourth optical anisotropic element is wider than that by the first optical anisotropic element.

6. The imaging apparatus according to claim 1, wherein a ray separation width by the third optical anisotropic element is wider than that by the second optical anisotropic element.

7. The imaging apparatus according to claim 1, wherein a ray separation width by the fourth optical anisotropic element is wider than that by the second optical anisotropic element.

8. The imaging apparatus according to claim 1, wherein the following condition is satisfied:

$Dx < Dp$ and $Dy < Dn$, or $Dx < Dp, Dx < Dn, Dy < Dp$ and $Dy < Dn$ where Dx is a ray separation width by the first optical anisotropic element, Dy is a ray separation width by the second optical anisotropic element, Dp is a ray separation width by the third optical anisotropic element, and Dn is a ray separation width by the optical anisotropic element is Dn.

9. The imaging apparatus according to claim 1, wherein a fast axis of the retardation plate is parallel or orthogonal to the first direction.

10. The imaging apparatus according to claim 1, wherein an angle formed by ray separation directions of the two optical anisotropic elements adjacent to each other is 120° or higher and 150° or lower.

11. The imaging apparatus according to claim 1, wherein the first to fourth optical anisotropic elements have the same ray separation widths.

12. The imaging apparatus according to claim 1, wherein among the first to fourth optical anisotropic elements, one that is closest to an image side and one that is closest to an object side are made of quartz, and remaining optical anisotropic elements are made of quartz or lithium niobate.

13. The imaging apparatus according to claim 1, wherein the first optical anisotropic element, the second optical anisotropic element, the retardation plate, the third optical anisotropic element, and the fourth optical anisotropic element are arranged in this order from an object side to an image side.

14. The imaging apparatus according to claim 1, wherein the first and fourth optical anisotropic elements are made of quartz, and the second and third optical anisotropic elements are made of lithium niobate.

15. The imaging apparatus according to claim 1, wherein the retardation plate is made of quartz having a thickness of 0.1 mm or more and 0.3 mm or less.

16. An optical low-pass filter used for an imaging apparatus that includes an image sensor, the optical low-pass filter comprising:
first, second, third, and fourth optical anisotropic elements each configured to separate incident ray into a plurality of rays; and
a retardation plate disposed between two optical anisotropic elements adjacent to each other among the first to fourth optical anisotropic elements
wherein the following condition is satisfied:

$-0.20 \leq I \leq 0.20$ $$I = \int_{\lambda_{max}}^{\lambda_{min}} s(\lambda) \cdot \cos(2\pi/\lambda \cdot \delta(\lambda)) d\lambda$$

where $\lambda$ is a wavelength of the light, $\delta(\lambda)$ is a phase difference of the retardation plate, $S(\lambda)$ is a normalized spectral sensitivity spectrum of the image sensor, and $\lambda$max and $\lambda$min are the longest wavelength and the shortest wavelength in an integration range that is 10% or more of a peak intensity of the $S(\lambda)$, respectively.

17. An optical low-pass filter comprising, in order from the light incident side to the light emitting side, first, second, third, and fourth optical anisotropic elements configured to separate an incident ray into a plurality of rays,
wherein the first and fourth optical anisotropic elements made of quartz, and the second and third optical anisotropic elements are made of lithium niobate.

18. The optical low-pass filter according to claim 17, further comprising a fifth optical anisotropic element disposed between the second and third optical anisotropic elements.

19. The optical low-pass filter according to claim 18, wherein the fifth optical anisotropic element is a retardation plate having an optical axis parallel to an optical surface of the fifth optical anisotropic element.

20. The optical low-pass filter according to claim 18, wherein the fifth optical anisotropic element is made of quartz.

21. The optical low-pass filter according to claim 18, wherein the optical low-pass filter is used with an image sensor configured to photoelectrically convert an optical image formed by light that has passed through the optical low-pass filter, and
wherein where a first direction and a second direction are two pixel arrangement directions orthogonal to each other in the image sensor, one of the first and second optical anisotropic elements separates the ray in the first direction, and the other separates the ray in a direction that forms an angle of 45° relative to the first direction, and
wherein one of the third and fourth optical anisotropic elements separates the ray in the second direction, and the other separates the ray in a direction that forms an angle of 45° relative to the second direction.

22. An imaging apparatus comprising:
an optical low-pass filter according to claim 17; and
an image sensor configured to photoelectrically convert an optical image formed by light that has passed through the optical low-pass filter.

* * * * *